United States Patent [19]
Robbins et al.

[11] Patent Number: 5,423,942
[45] Date of Patent: Jun. 13, 1995

[54] METHOD AND APPARATUS FOR REDUCING ETCHING EROSION IN A PLASMA CONTAINMENT TUBE

[75] Inventors: Roger A. Robbins, Allen; Donald E. Brown, Bedford; David W. Buck, Mesquite; Alan D. Rose, Wylie, all of Tex.

[73] Assignee: Texas Instruments Incorporated, Dallas, Tex.

[21] Appl. No.: 262,800

[22] Filed: Jun. 20, 1994

[51] Int. Cl.⁶ .............................................. H05H 1/00
[52] U.S. Cl. .................................. 156/643.1; 156/345
[58] Field of Search ................. 156/643, 646, 345; 118/723 ME, 723 MR, 723 ER; 204/298.38, 298.33, 298.07

[56] References Cited

U.S. PATENT DOCUMENTS

| | | | |
|---|---|---|---|
| 5,002,632 | 3/1991 | Loewenstein et al. | 156/643 |
| 5,082,517 | 1/1992 | Moslehi | 156/345 |
| 5,084,126 | 1/1992 | McKee | 156/345 |
| 5,349,154 | 9/1994 | Harker et al. | 427/575 X |

*Primary Examiner*—Thi Dang
*Attorney, Agent, or Firm*—Robby T. Holland; Wade James Brady, III; Richard L. Donaldson

[57] ABSTRACT

A method and apparatus is provided for reducing wall erosion in a plasma containment tube (20), such as, for example, a quartz plasma tube (20) used in a microwave-induced plasma reaction process for etching semiconductor wafers. A pure benign or non-corrosive gas (Ar) is introduced into the "upstream" section (22a) of the tube (22), where the microwave energy is imparted to create a plasma. The activated benign gas flows "downstream" through a flange (28), preferably made of quartz, which is seated on o-rings (50) inside a water-cooled metal flange (48). These sealing o-rings (50) are thus cooled and removed from the ultraviolet light created by the plasma. The corrosive etchant gas ($SF_6$) is introduced into the "downstream" section (22b) of the tube (22) beyond the flange (28), where it is activated by the benign gas (Ar). The benign gas (Ar) flows principally along the inner sidewalls of the tube (22), and the etchant gas ($SF_6$) is thus principally contained by the benign gas (Ar) in the center of this section (22b) of the tube. This "downstream" section (22b) of the tube (22) is surrounded by a water jacket (24), which channels coolant around the outer surface of the tube (22b). Consequently, etching erosion of the inner surface of the tube (22) is minimized in the "upstream" or microwave section (22a) where the plasma is hottest, and also in the "downstream" section (22b) where the corrosive etchant gas ($SF_6$) is activated.

20 Claims, 1 Drawing Sheet

METHOD AND APPARATUS FOR REDUCING ETCHING EROSION IN A PLASMA CONTAINMENT TUBE

TECHNICAL FIELD OF THE INVENTION

This invention relates generally to a plasma reaction process used to etch semiconductor wafers, and more particularly, to a method and apparatus for reducing wall erosion in a plasma containment tube during a reaction process.

BACKGROUND OF THE INVENTION

Semiconductor integrated circuits may be fabricated by etching and vapor depositing certain materials in layers on a silicon wafer to form desired circuit patterns. In an existing fabrication process, the integrated circuits are formed from silicon wafers etched in a vacuum plasma reaction chamber.

A common etching technique employs microwave energy to induce a plasma in a quartz containment tube that is located "upstream" of the reaction chamber. The plasma flows "downstream" through the tube and into the reaction chamber, where the wafer is located and the etching/vapor deposition process ultimately takes place.

More precisely, a microwave generator imparts microwave energy into the "upstream" portion of the containment tube. A combination of process gases are contained in the tube. The quartz tube conducts the activated gases "downstream" to the plasma reaction chamber and the wafer. FIG. 1 illustrates a side view of a typical "upstream" section of a microwave-induced plasma reaction system.

Referring to FIG. 1, an "upstream" section 10 of a microwave-induced plasma reaction system is shown. An etchant chemical in gaseous form (e.g., $SF_6$ or fluorine gas) flows from an external gas supply (not shown) through input gas coupling 12 to quartz tube 16. The cavity section of microwave generator 18 surrounds a segment of quartz tube 16. Microwave generator 18 imparts microwave energy into quartz tube 16 via the cavity, which activates the etchant gas flowing in the tube. The activated etchant gas forms a plasma that flows through reaction chamber entry seal 17 and into the reaction chamber (not shown), where the wafer to be etched is located. An o-ring 14 seals gas line 12 to the outer surface of quartz tube 16, and another o-ring 19 seals the outer surface of quartz tube 16 to an aperture formed in entry seal 17, which forms a section of a wall of the plasma reaction chamber. The quartz tube and reaction chamber are sealed to maintain a high vacuum (e.g., less than 1–2 Torr).

A significant problem encountered with existing microwave-induced plasma reaction systems such as that illustrated by FIG. 1, is that the very corrosive chemicals activated in quartz tube 16 in the vicinity of the microwave cavity etch the inner walls of the tube. Consequently, quartz particles that are etched from the surface of the tube flow to, and contaminate the surface of, the wafer. Furthermore, the corrosive etchant can eventually eat through the walls of the tube, which can cause the tube to fail and possibly implode. A second, significant problem with the system of FIG. 1 is that the extremely high temperature of the microwave-induced plasma overheats the o-ring seals and eventually causes them to fail. Consequently, the o-ring seals must be replaced often enough to ensure that they do not fail during the plasma reaction process.

One technique that has been considered to solve the above-described quartz etching and contamination problem is to replace the quartz tube with a tube made of a more durable material that does not react readily with fluorine (e.g., a common etchant). For example, materials such as sapphire or certain specialized ceramics do not react readily with fluorine and may be used to form a plasma containment tube. However, the cost to use these materials for a plasma containment tube would be very high, if not prohibitive.

As for the o-ring overheating problem, one potential solution is to encase the regions around the o-rings with water jackets and cool the o-rings with water flowing through the jackets. However, the use of water cooling jackets increases the complexity and cost of the overall process and also creates internal stresses in the cooled areas of the tube near the microwave energy region that increases the chances of tube failure. Moreover, ultraviolet light created by the plasma can impinge on the o-rings, which causes them to deteriorate and eventually fail.

One technique that has been used to minimize the quartz tube etching and contamination problem is to introduce a benign, non-corrosive gas into the quartz tube in the vicinity of the microwave cavity. Consequently, the benign gas is activated to form a plasma by the microwave energy. The etchant or active species of gas is then introduced into the tube "downstream" of the microwave cavity region. Consequently, the "activated" benign gas, in turn, activates the fluorine in the active species of gas.

Specifically, the etchant gas is introduced into the benign gas stream in the quartz tube via a tributary tube disposed perpendicularly to the direction of gas flow in the quartz tube. Consequently, when the etchant gas enters the quartz tube, it flows across the quartz tube and impinges on the opposite wall. This stream of etchant gas rebounds from the opposite wall of the quartz tube, and about half of it flows "upstream" in the tube while the other half flows "downstream". The "upstream" portion of the etchant gas flows into the vicinity of the microwave cavity, where microwave energy is imparted into the gas to activate the etchant chemical. The "downstream" portion of the etchant gas flows to the reaction chamber. Typically, the activated etchant gas in the vicinity of the microwave cavity etches the inner walls of the quartz tube. However, it has been determined experimentally that if the walls of the quartz tube can be cooled just "downstream" of the microwave cavity region, then the quartz etching rate can be significantly reduced. Unfortunately, it is inefficient and thus impractical to place a water jacket around the quartz tube in the vicinity of the microwave cavity, since a significant portion of the microwave energy will heat the water in the jacket instead of activating the etchant gas.

SUMMARY OF THE INVENTION

Accordingly, a need exists in the integrated circuit manufacturing industry for a technique to reduce etching erosion in a plasma containment tube. In accordance with the present invention, a method and apparatus is provided for reducing wall erosion in a plasma containment tube, such as, for example, a quartz plasma tube used in a microwave-induced plasma reaction process for etching semiconductor wafers. A pure benign or non-corrosive gas is introduced into the "upstream" section of the tube, where the microwave energy is imparted to create a plasma. The activated benign gas flows "downstream" through a flange, preferably made of quartz, which is seated on o-rings inside a water-cooled metal flange. These sealing o-rings are thus cooled and removed from the ultraviolet light created by the plasma. The corrosive etchant gas is introduced into the "downstream" section of the tube beyond the flange, where it is activated by the benign gas. The benign gas flows principally along the inner sidewalls of the tube, and the etchant gas is thus principally contained by the benign gas in the center of this section of the tube. This "downstream" section of the tube is surrounded by a water jacket, which channels coolant around the outer surface of the tube. Consequently, etching erosion of the inner surface of the tube is minimized in the "upstream" or microwave section where the plasma is hottest, and also in the "downstream" section where the corrosive etchant gas is activated.

An important advantage of the present invention is that etching contamination of the semiconductor wafer is reduced, which improves the overall integrated circuit fabrication process. A second important advantage of the present invention is that o-ring seal deterioration by overheating is diminished, which increases the life of the o-rings and reduces their potential to fail and, therefore, disrupt the wafer fabrication process.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
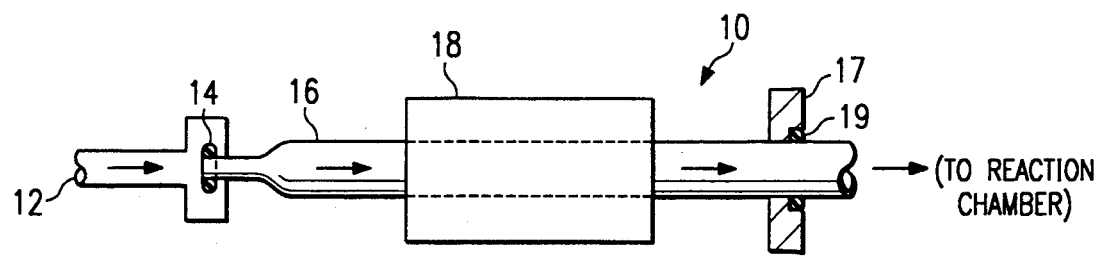
FIG. 1 illustrates a side view of a typical "upstream" section of a microwave-induced plasma reaction system.
Figure 2:
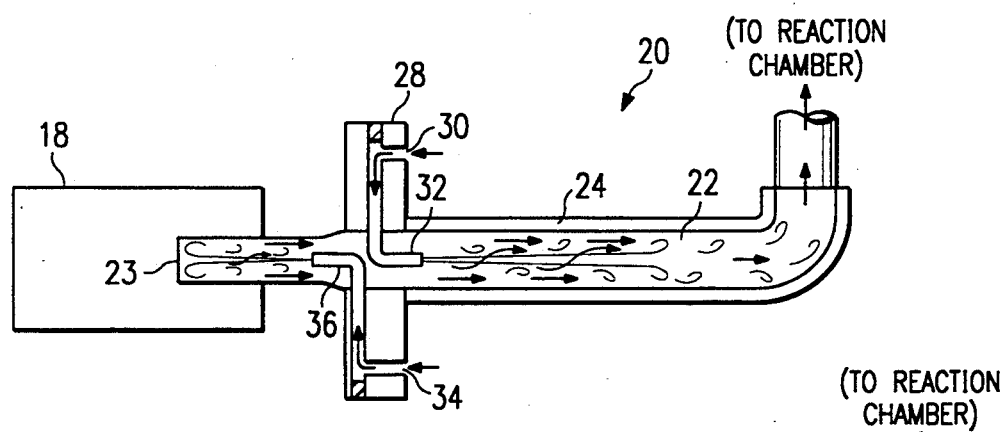
FIG. 2 illustrates a side view of an "upstream" section 20 of a microwave-induced plasma reaction system constructed in accordance with a preferred embodiment of the present invention.
Figure 3:
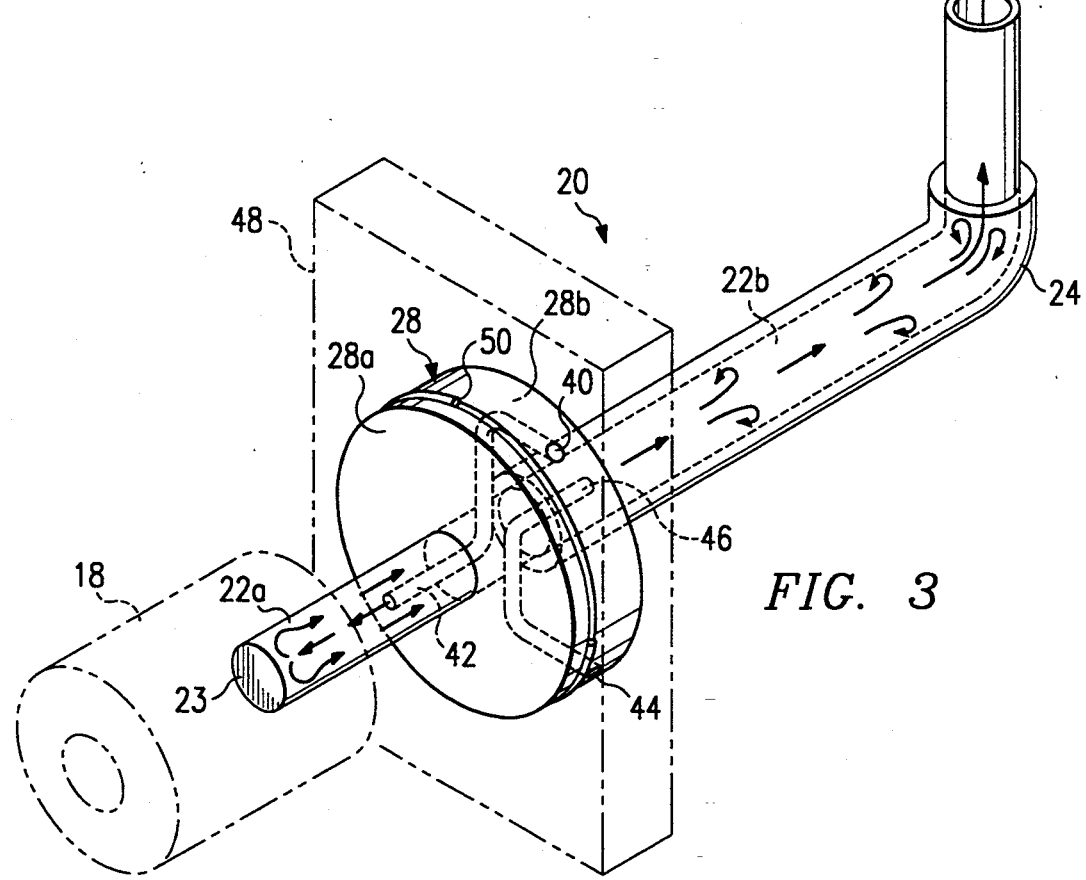
FIG. 3 illustrates a perspective, and more detailed, view of the "upstream" section of the microwave-induced plasma reaction system shown in FIG. 2.

The preferred embodiment of the present invention and its advantages are best understood by referring to FIGS. 1-3 of the drawings, like numerals being used for like and corresponding parts of the various drawings.

FIG. 2 illustrates a side view of an "upstream" section 20 of a microwave-induced plasma reaction system constructed in accordance with a preferred embodiment of the present invention. Referring to FIG. 2, "upstream" section 20 includes plasma containment tube 22. Preferably, tube 22 may be formed from quartz, but the present invention is not intended to be limited to a particular material for tube 22. Tube 22 may be formed from any material that is appropriate for use in containing an activated etchant gas in a plasma reaction process. Tube 22 includes a closed end surface 23 and an opposite, open end which is coupled to the plasma reaction chamber (not shown) where a semiconductor wafer to be processed is located. Closed end surface 23 of quartz tube 22 may be disposed in the energy region of the transmitter cavity of microwave generator 18. Consequently, the section of tube 22 including closed end surface 23 may be immersed in the microwave energy radiated from generator 18.

A flange member 28 may be arranged to surround tube 22, between the closed end ("upstream") section of tube 22 and the open end ("downstream") section of the tube. Notably, the inclusion of flange member 28 and closed end surface 23 eliminates the need for o-ring 14 shown in FIG. 1. Flange member 28 may be constructed of quartz, for example. A water jacket 24 may surround the "downstream" section of tube 22. Coolant water may be channeled through water jacket 24, which is connected to a coolant water supply via a series of valves and connections (not shown). A quartz capillary tube 32 may be disposed in a sidewall of flange member 28. Tube 32 may be quartz welded to the sidewall of flange member 28. Similar to the material used for tube 22 or flange member 28, any suitable material that can withstand the harsh, plasma environment may be substituted for the material quartz in capillary tube 32. The output or injector nozzle of capillary tube 32 protrudes through a hole drilled or otherwise formed in the upper sidewall of tube 22. The injector nozzle of capillary tube 32 may be bent at a right angle to the sidewall of flange member 28 so that the nozzle is directed "downstream" in the center of quartz tube 22.

A second quartz capillary tube 36 may be disposed in the sidewall of flange member 28. The injector nozzle of capillary tube 36 protrudes through a second hole drilled or otherwise formed in the lower sidewall of tube 22. The injector nozzle of capillary tube 36 may be bent at a right angle to the sidewall of flange member 28. However, in this case, the injector nozzle of tube 36 is directed "upstream" or toward closed end surface 23 of quartz tube 22 but still in the center of the tube.

A benign gas (e.g., argon gas) is coupled from a gas supply via a series of valves and tubing (not shown) to the input port 34 of flange member 28. Input port 34 is connected to the input section of capillary tube 36. Although input port 34 is shown for illustrative purposes, the benign gas is actually supplied to the input of capillary tube 36 via a "channel" (not shown) formed in flange member 28. This channel may be formed by drilling diametrically through the flange member. The external opening of the channel may then be welded shut. In any event, the specific orientation of such a channel is not intended to be an important aspect of the present invention.

The active etchant gas (e.g., $SF_6$ or fluorine) is provided from an external gas supply via a series of gas valves and tubing (not shown) to the input port 30 of flange member 28. Input port 30 may be connected to the input section of capillary tube 32. Similar to the "channel" arrangement described above with respect to the provision of benign gas to capillary tube 36, a second "channel" also may be diametrically drilled through flange member 28 and connected to capillary tube 32 to form the input section of tube 32. However, although the two gas input "channels" shown in FIG. 2 are illustrated as being formed in opposite sections of flange member 28, the specific orientation of these two gas input channels is not to be construed as a limitation of the present invention. As described below with respect to FIG. 3, it is the orientation and function of the injection nozzles of capillary tubes 32 and 36 that is an important inventive concept.

FIG. 3 illustrates a perspective, and more detailed, view of the "upstream" section 20 of a microwave-induced plasma reaction system such as that shown in FIG. 2. Referring to FIG. 3, the plasma containment tube 22 shown in FIG. 2 may be separated into two sections 22a and 22b in FIG. 3. Section 22a of tube 22 may be welded to the leftmost sidewall 28a of flange member 28, and section 22b may be welded to the opposite, rightmost sidewall 28b of flange member 28. The transmitting cavity of microwave generator 18 may surround a segment of tube section 22a. A hole having an internal diameter that is equal to the internal diameters of quartz tube sections 22a and 22b is drilled, machined, or otherwise formed through the center of flange member 28. Thus, a continuous flow of gas may be maintained through the two quartz tube sections 22a and 22b and flange member 28. In a preferred embodiment of the present invention, flange member 28 may be constructed of quartz. Flange member 28 can be seated on an o-ring 50 fitted along an inner circumference of a hole formed in metal flange member 48. Consequently, o-ring 50 forms a vacuum seal between the outer circumference of flange member 28 and the inner circumference of flange member 48. The rightmost surface of flange member 48 may be attached and sealed to an entrance formed in a wall of the reaction chamber (not shown) so that tube section 22b is vacuum sealed in the chamber. O-ring 50 is located a significant distance away from the plasma contained in quartz tube 22, which effectively shields o-ring 50 from ultraviolet light to prevent deterioration and failure. Furthermore, flange member 48 may be constructed of brass, which is a relatively good thermal conductor, in order to transfer heat away from o-ring 50 and prevent it from overheating and failing. In another aspect of the invention, flange member 48 may be constructed of stainless steel, which is a poorer thermal conductor than brass but has an expansion rate that is closely aligned with that of quartz and, consequently, can reduce stress buildup in a quartz flange member as the operating temperature rises. Nevertheless, flange member 48 may have a series of water coolant channels formed internally (not explicitly shown), which helps to cool o-ring 50 even further.

The benign gas (e.g., Argon) may be introduced into "upstream" section 22a of plasma containment tube 22 via the injection nozzle of capillary tube 42. Capillary tube 42 is preferably constructed of quartz, but it may be formed from any appropriate material that adequately performs the plasma containment function of tube 42. The etchant gas (e.g., fluorine) may be introduced into "downstream" section 22b of plasma containment tube 22 via the injection nozzle of capillary tube 46. Capillary tube 46 may be constructed of the same material that is used to form capillary tube 42. The benign gas is supplied from an external gas supply (not shown) that is connected to gas input port 40 via a series of valves and tubing (not shown). The etchant gas is supplied from a second external gas supply (not shown) that is connected to gas input port 44 via a second series of valves and tubing (not shown). Gas input ports 40 and 44 may be formed in the outer perimetrical surface of flange member 28.

A series of coolant channels (not shown) may be formed in flange member 48. A coolant input connection and output connection (not shown) may be formed in the outer perimetrical surface of flange member 48. Consequently, flange member 28 may be cooled by water, for example, flowing through the series of coolant channels formed in the surrounding metal flange. A water jacket 24 may surround the outer surface of "downstream" section 22b of plasma containment tube 22. Coolant flow channels (not shown) in jacket 24 are connected to the coolant channels formed in the interior of flange member 48. Consequently, the coolant (e.g., water) may be conducted through the channels in flange member 48 and also through the channels formed in water jacket 24, which substantially cools the "downstream" section of containment tube 22.

Referring to FIG. 3 to facilitate an understanding of the operation of the present invention, the active etchant gas (e.g., fluorine gas) may be coupled through input port 44 and injected through nozzle 46 into the center of containment tube section 22b. Nozzle 46 directs the etchant gas "downstream" in a thin stream in the center of tube section 22b. The benign gas (e.g., argon gas) is coupled through input port 40 and injected through nozzle 42 into the center of containment tube section 22a. Nozzle 42 directs the benign gas "upstream" in a thin stream in the center of tube section 22a. The stream of benign gas rebounds from closed end surface 23 and flows "downstream" principally along the inner perimeter of the sidewall of tube 22. The cavity of microwave generator 18 functions to impart energy into "upstream" section 22a of tube 22, which activates the benign gas as it flows "downstream". The activated benign gas flows as a plasma through flange member 28 into "downstream" section 22b of plasma tube 22. This activated gas flows principally along the inner perimeter of the sidewall of tube section 22b, where it surrounds the etchant gas that is flowing in the center of the tube. In other words, the activated benign gas flows "downstream" principally between the stream of etchant gas and the sidewalls of tube section 22b. The activated gas, which has rebounded from closed end surface 23, flows at a relatively low velocity when it reaches tube section 22b, while the newly injected etchant gas flows directly into tube section 22b from nozzle 46 at a relatively high velocity. Consequently, multiple vortices of gas are created that cause the activated gas and the etchant gas to mix, which enhances the transfer of excitation energy from the activated gas to the etchant gas. Additionally, since the etchant gas has been injected into tube section 22b with such a high velocity, it will remain in the center of the tube for a relatively long distance before it diffuses to the sidewalls of the tube. Nevertheless, when the etchant gas eventually reaches the sidewalls of tube section 22b, it will begin to etch these sidewalls. However, since section 22b is surrounded by a coolant (e.g., water) jacket, the sidewalls of tube section 22b are cooled and, consequently, the etching process in the tube is significantly retarded. Therefore, a relatively small amount of sidewall particulate material may flow "downstream" to the etching region of the reaction chamber where the wafer is located. The gas may be directed by the quartz "chimney" section of tube 22 through the final leg of the journey to the wafer. However, in accordance with the teachings of the present invention, the gas activation levels are diminished, and the etchant stream flows substantially parallel to the sidewalls of the chimney. Therefore, the quartz etching rate is depressed at these sidewalls, which provides a clean (i.e., free of quartz particles) environment for delivering the etchant to the wafer.

Although the present invention and its advantages have been described in detail, it should be understood that various changes, substitutions and alterations can be made herein without departing from the spirit and scope of the invention as defined by the appended claims.

What is claimed is:

1. A method of reducing sidewall erosion in a plasma containment tube, comprising the steps of:
   directing a flow of benign gas downstream principally along the sidewall of the plasma containment tube;
   flowing an etchant gas downstream in a downstream portion of the plasma containment tube, said etchant gas being principally surrounded by said directed flow benign gas; and
   inducing a plasma in said benign gas upstream of said etchant gas flow.

2. The method of claim 1, further comprising the step of:
   cooling said downstream portion of the plasma containment tube.

3. The method of claim 1, wherein said directing step further comprises the steps of:
   flowing said benign gas upstream in a center of an upstream portion of the plasma containment tube; and
   rebounding said upstream flowing benign gas off a closed end surface of said upstream portion of the plasma containment tube and thereby directing said flow of benign gas downstream principally along the sidewall of the plasma containment tube.

4. The method of claim 1, wherein said inducing step further comprises the step of:
   transferring microwave energy to said benign gas upstream of said etchant gas flow.

5. The method of claim 1, further comprising the step of: activating said etchant gas with said plasma induced in said benign gas.

6. The method of claim 1, wherein said benign gas comprises Argon gas.

7. The method of claim 1, wherein said etchant gas comprises $SF_6$ gas.

8. The method of claim 1, wherein the plasma containment tube is constructed of quartz.

9. The method of claim 2, wherein said cooling step further comprises the step of: cooling said downstream portion of the plasma containment tube with water.

10. An apparatus for use in reducing sidewall erosion in a plasma containment tube, comprising:
    a first flange member, said first flange member including a first perimetrical surface, a first outer surface and a second outer surface, said second outer surface opposite said first outer surface, and a first substantially circular aperture formed therethrough from said first outer surface to said second outer surface;
    an upstream tubular segment including a first open end, a second closed end and a first internal sidewall, said first open end rigidly fastened to said first outer surface and arranged to mate with said first aperture, an internal diameter of said first aperture substantially equal to an internal diameter of said upstream tubular segment;
    a downstream tubular segment including a third open end, a fourth open end and a second internal sidewall, said third open end rigidly fastened to said second outer surface and arranged to mate with said first aperture, said internal diameter of said first aperture substantially equal to an internal diameter of said downstream tubular segment;
    a first nozzle disposed in said upstream tubular segment and operable to direct a benign gas upstream at a center of said second closed end;
    a second nozzle disposed in said downstream tubular segment and operable to direct an etchant gas downstream in a center of said downstream tubular segment; and
    an energy generator coupled to said upstream tubular segment and operable to impart energy to activate said benign gas to form a plasma.

11. The apparatus according to claim 10, wherein said apparatus further comprises:
    a coolant member thermally coupled to said downstream tubular segment and operable to cool said downstream tubular segment.

12. The apparatus according to claim 10, wherein said first flange member is constructed of quartz.

13. The apparatus according to claim 10, wherein said downstream and upstream tubular segments are constructed of quartz.

14. The apparatus according to claim 10, wherein said first and second nozzles are constructed of quartz.

15. The apparatus according to claim 10, wherein said benign gas comprises argon.

16. The apparatus according to claim 10, wherein said etchant gas comprises $SF_6$ gas.

17. The apparatus according to claim 10, wherein said coolant member further comprises a water jacket arranged to surround a portion of said downstream tubular segment.

18. The apparatus according to claim 10, said apparatus further comprising:
    a second flange member, said second flange member including a second substantially circular aperture formed therethrough, a diameter of said second aperture slightly larger than a diameter at said perimetrical surface of said first flange member; and
    an o-ring disposed between said perimetrical surface of said first flange member and an inner surface of said second aperture so as to form a seal between said first flange member and said second flange member.

19. The apparatus according to claim 11, wherein said second flange member is constructed of brass.

20. The apparatus according to claim 11, wherein said second flange member includes at least a coolant channel therein.

* * * * *